US010540462B2

(12) United States Patent
Yu et al.

(10) Patent No.: US 10,540,462 B2
(45) Date of Patent: Jan. 21, 2020

(54) METHOD AND APPARATUS FOR SPEEDING UP GATE-LEVEL SIMULATION

(71) Applicant: Taiwan Semiconductor Manufacturing Co., Ltd., Hsin-Chu (TW)

(72) Inventors: Chih-Yuan Stephen Yu, San Jose, CA (US); Wenyuan Lee, San Jose, CA (US); Boh-Yi Huang, Hsin-Chu (TW); Brent Lui, San Jose, CA (US); Tze-Chiang Huang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 289 days.

(21) Appl. No.: 15/645,938

(22) Filed: Jul. 10, 2017

(65) Prior Publication Data

US 2018/0165394 A1 Jun. 14, 2018

Related U.S. Application Data

(60) Provisional application No. 62/433,910, filed on Dec. 14, 2016.

(51) Int. Cl.
*G06F 17/50* (2006.01)
*G06F 11/00* (2006.01)

(52) U.S. Cl.
CPC .......... *G06F 17/5027* (2013.01); *G06F 17/50* (2013.01); *G06F 17/5081* (2013.01)

(58) Field of Classification Search
USPC ........................... 703/2, 13, 22, 24; 716/106
See application file for complete search history.

(56) References Cited

U.S. PATENT DOCUMENTS

| 8,781,808 | B2 * | 7/2014 | Yang | G06F 17/5022 703/13 |
|---|---|---|---|---|
| 2009/0150136 | A1 * | 6/2009 | Yang | G06F 17/5022 703/13 |
| 2009/0228849 | A1 * | 9/2009 | Mossawir | G06F 17/504 716/106 |
| 2011/0184713 | A1 * | 7/2011 | Yang | G06F 17/5022 703/13 |
| 2014/0325461 | A1 * | 10/2014 | Moheban | G06F 17/505 716/104 |

(Continued)

*Primary Examiner* — Thai Q Phan
(74) *Attorney, Agent, or Firm* — Duane Morris LLP

(57) ABSTRACT

A method includes providing a register transfer level (RTL) description of a circuit design, providing a plurality of RTL-to-gate-level mapping details by translating the RTL description into a gate-level netlist, providing one or more input/output (I/O) variables as stimulus to simulate the RTL description of the circuit design, capturing a plurality of internal operation values from the simulated RTL description at a beginning time of a specified period of time wherein the specified period of time is less than a time period required to compete a full-scale simulation, mapping the captured internal operation values to corresponding gate-level nodes of the gate-level netlist, capturing a plurality of I/O values from the I/O variables at the beginning time of the specified period of time, and simulating the circuit design in a gate-level for the specified period of time based on the mapped internal operation values and the captured I/O values.

20 Claims, 12 Drawing Sheets

(56) References Cited

U.S. PATENT DOCUMENTS

2015/0213407 A1* 7/2015 Cabler ................. G06Q 10/101
                                                      705/300
2016/0217239 A1* 7/2016 Venkatesh ........... G06F 17/5036

* cited by examiner at time "$t_5$"

METHOD AND APPARATUS FOR SPEEDING UP GATE-LEVEL SIMULATION

CROSS-REFERENCE TO RELATED APPLICATION

The present application claims priority to U.S. Provisional Patent Application No. 62/433,910, filed on Dec. 14, 2016, which is incorporated by reference herein in its entirety.

BACKGROUND

Integrated circuit (IC) technology is continuously increasing in complexity due to improvements in semiconductor process fabrication techniques. Complete system-on-chip (SoC) solutions, involving many elements such as a processor, timer, interrupt controller, bus, memory, and/or embedded software on a single circuit, are now available for a variety of applications. Software development, early hardware architecture exploration and functional verification of a complex SoC circuit or processor device are challenges faced by the semiconductor industry. At process fabrication technologies of 32 nm or smaller (e.g., advanced technology nodes), with millions or more of transistors available to implement large and complex SoC circuits, the challenge of functionally verifying such complex devices grows exponentially. Industry data suggests that upwards of 80% of all project resources are allocated to software development and functional verification of these devices.

An IC design process typically begins with a software program that describes the behavior or functionality of a circuit to be created. Such a software program is typically written in procedural programming languages such as C, C++, Verilog, and VHDL that define behavior to be performed with limited implementation details. The IC design process involves complex sub-processes each requiring one or more intermediate steps. At each of these intermediate steps, the IC design is represented at a different level of specificity.

One of higher level descriptions of an IC design is a register transfer level (RTL) design. In the RTL design, variables and data operators represent the IC components such as registers and functional blocks of the sections of the IC. Being a more generic high-level description of the IC design, the RTL design could be easily mapped across different IC design process technologies.

The next lower level description of the IC design is a gate-level design at which the IC is defined as a set of interconnecting logic gates such as AND, OR gates and memory components such as flip-flops. The IC design at this level of specificity will be referred to as a "netlist" in the following discussion. A netlist is a more specific definition of the IC design in the gate-level design than that in the RTL design. Also, the gate-level design is typically technology and process specific. Thus, it can be understood by people of ordinary skill in the art that verifying/simulating an IC design in the gate-level takes much more resource and time t0 finish than in the RTL. However, lately, there is an increasing trend in industry to perform at least one gate-level simulation before going into a last stage of chip manufacturing since the gate-level simulation typically provides more accurate results, which advantageously increases confidence in verifying the IC design's power, performance, timing, area estimations, etc.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

As mentioned above, simulating an IC design in the gate-level is typically more accurate but more time/resource-consuming than in the RTL since, in the gate-level, a full-scale simulation is conventionally required. For example, time for performing a full-scale gate-level simulation on a modem SoC circuit may take days or up to weeks to finish (e.g., millions to billions cycles). During a full-scale operation period of an SoC circuit, the SoC circuit generally goes through plural phases (e.g., an initialization phase, a configuration phase, a memory access phase, an idle phase, a central processing unit (CPU) operating phase, etc.), wherein each phase consumes respective time and power to complete. In general, while estimating overall performance (e.g., power consumption) of the SoC circuit, the overall performance is dominated by one or more phases such as, for example, the CPU operating phase, the memory access phase, etc.

Accordingly, the present disclosure provides various embodiments of methods and systems to perform a gate-level simulation on an IC design to accurately estimate one or more performance characteristics of the IC design while avoiding a significant amount of time t0 complete the simulation by utilizing respectively advantageous characteristics of the RTL design and the gate-level design of the SoC circuit. Unlike conventional gate-level simulations, which require full-scale simulations as discussed above, the disclosed systems and methods allow performing the gate-level simulation on the IC design for any desired period of time, which greatly decreases the amount of resource and time for the gate-level simulation while providing the accuracy that can only be provided in the gate-level simulation.

Figure 1A:
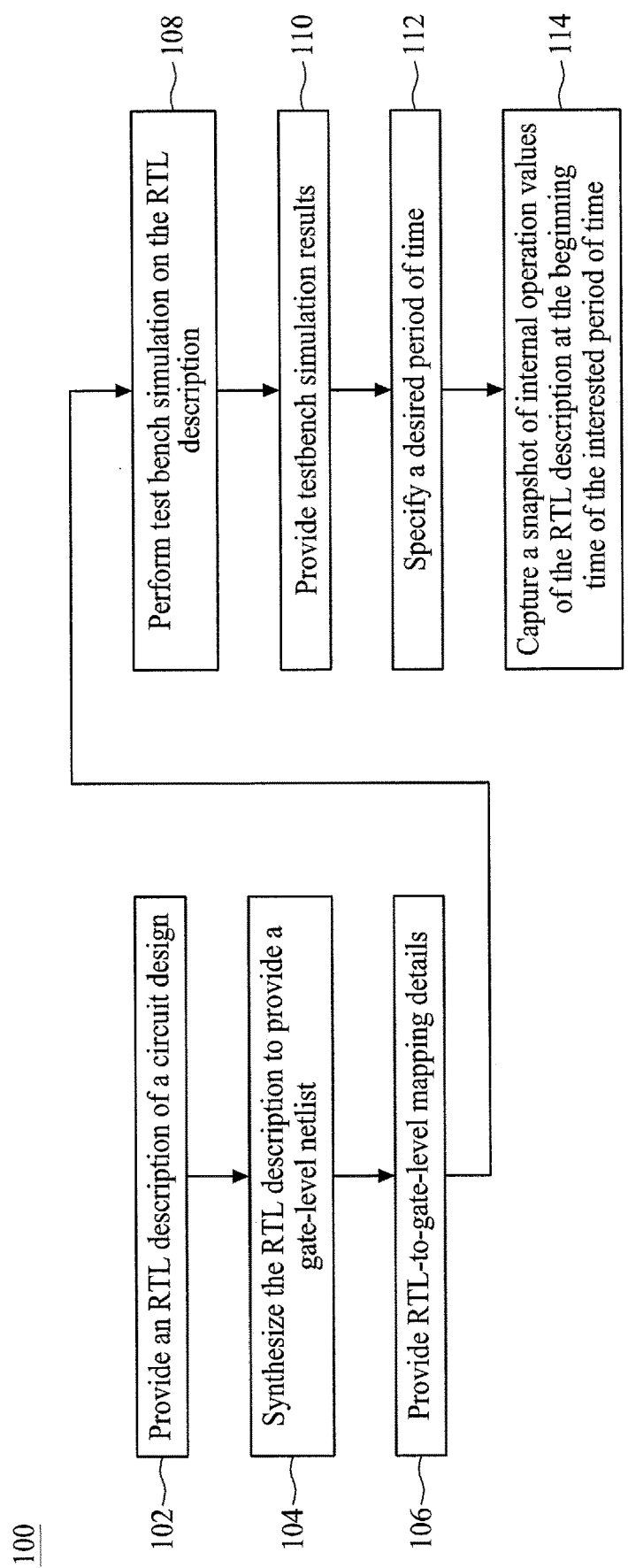
FIGS. 1A and 1B illustrate a flow chart of a method to perform a gate-level simulation on an IC design, in accordance with some embodiments.
Figure 1B:
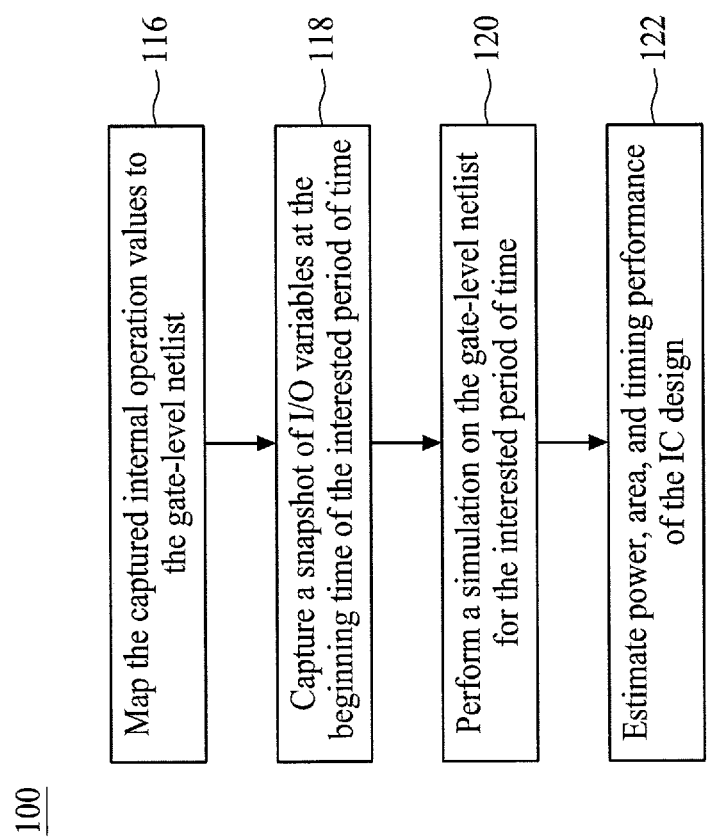

FIGS. 1A and 1B collectively illustrate an exemplary flow chart of a method 100 to estimate the power consumption, minimum required area, and timing of an IC design (hereinafter referred to as the "power, area and timing performance of the IC design") by performing a faster gate-level simulation on the IC design when compared to conventional gate-level simulations, in accordance with some embodiments. It is noted that the method 100 is merely an example, and is not intended to limit the present disclosure. Accordingly, it is understood that additional operations may be provided before, during, and after the method 100 of FIGS. 1A and 1B, and that some other operations may only be briefly described herein. In some embodiments, the IC design may include any of a variety of circuit designs such as, for example, a system-on-chip (SoC) circuit design, an application-specific integrated circuit (ASIC) design, a circuit design from a semiconductor intellectual property core/library (IP core/library), etc.

In accordance with some embodiments of the present disclosure, the method 100 starts with operation 102 in which an RTL description of a circuit design is provided. The method continues to operation 104 in which a corresponding gate-level netlist of the circuit is provided by synthesizing the RTL description. The method 100 continues to operation 106 in which a plurality of RTL-to-gate-level (RtG) mapping details are concurrently provided through the synthesis of the RTL description, as discussed in further detail below. The method 100 continues to operation 108 in which one or more test bench simulations are performed on the circuit design based on the RTL description. The method 100 continues to operation 110 in which a simulated result based on the RTL description is provided. In some embodiments, the simulated result is a full-scale simulated result that includes all operation phases of the circuit design. The method 100 continues to operation 112 in which a desired period of time (e.g., including one or more dominant operation phases of the circuit design) is specified. The method 100 continues to operation 114 in which a snapshot including a plurality of internal operation values of the RTL description at a beginning time of the specified period of time is captured. The method 100 continues to operation 116 in which the captured internal operation values of the RTL design are mapped to the gate-level netlist (provided by operation 104) as gate-level operation values by using the RtG mapping details (provided by operation 106). The method 100 continues to operation 118 in which a snapshot including a plurality of input/output (I/O) variables of the test bench simulation is captured at the beginning time of the specified period of time. The method 100 continues to operation 120 in which a gate-level simulation is performed, for the specified period of time, on the circuit design based on the gate-level netlist by using the captured I/O variables and the mapped gate-level operation values. The method 100 continues to operation 122 in which the power, area, and timing performance of the circuit design are estimated based on a result of the gate-level simulation (operation 120).

Operations of the method 100 may be associated with illustrated embodiments of an exemplary circuit design at various simulation stages as shown in FIGS. 2, 3A, 3B, 4, 5, 6A, 6B, 7, 8, and 9, respectively. In some embodiments, the circuit design may include a memory circuit. The memory circuit may be included in a larger circuit, e.g., a microprocessor, a memory cell, and/or other integrated circuits (IC's). Also, it is noted that at least some of the figures described herein contain symbolic or logic representations of functions to facilitate a better understanding of various concepts of the present disclosure.

Figure 2:
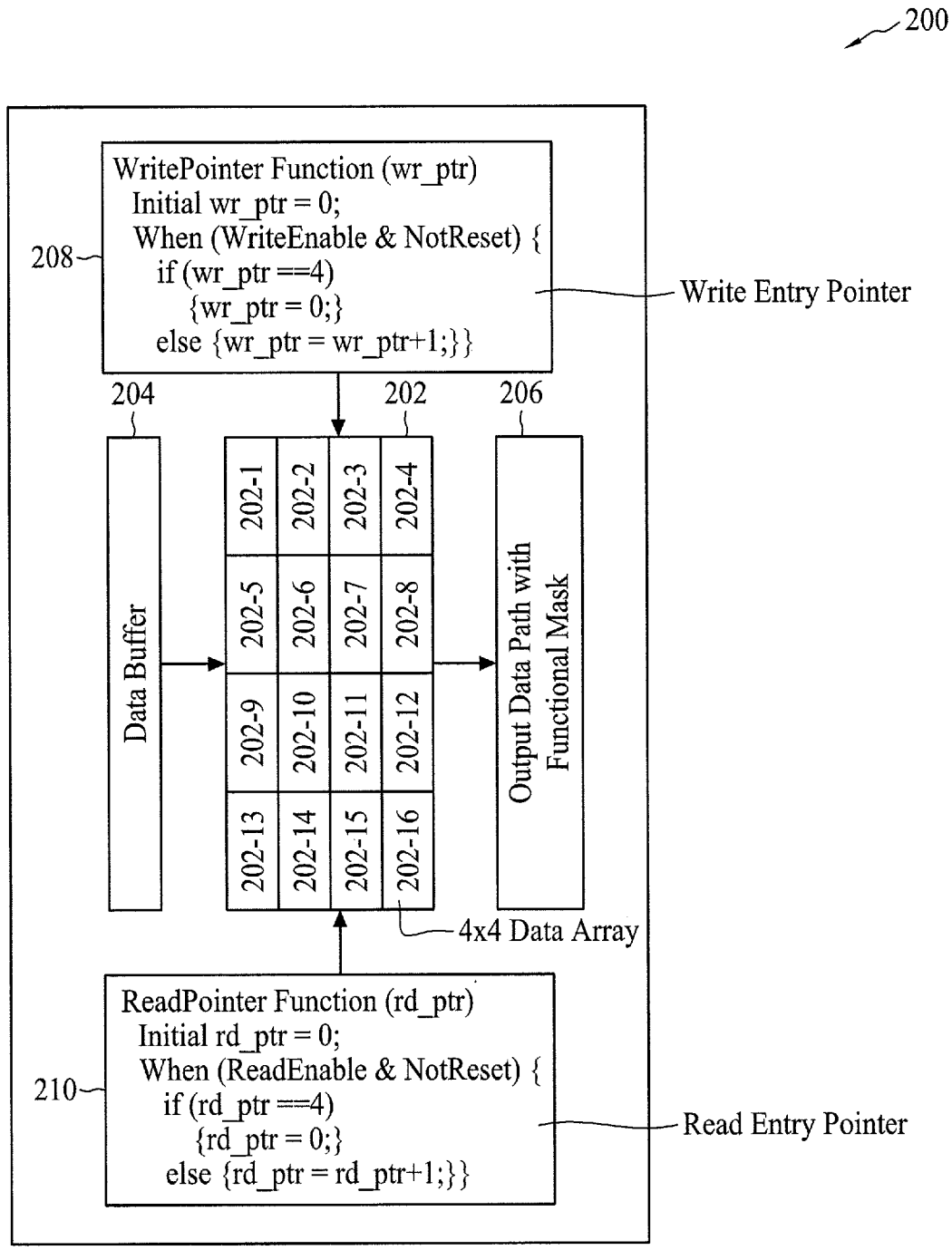
FIG. 2 illustrates an exemplary register transfer level (RTL) description of the IC design provided by the method of FIG. 1, in accordance with some embodiments.

Corresponding to operation 102, FIG. 2 illustrates an RTL description 200 of a memory circuit, in accordance with some embodiments. As mentioned above, an RTL description of an IC includes abstract behavioral descriptions of the IC by using variables and data operators to represent components of the IC (e.g., registers and/or functional blocks of the IC). Hardware description languages (HDL's) e.g., Verilog and/or VHDL, are typically used to create such a high-level representation of an IC. As shown in FIG. 2, the RTL description 200 includes five descriptive blocks 202, 204, 206, 208, and 210 to implement the memory circuit.

In the RTL description 200, block 202 may be described as a "4×4 Data Array;" block 204 may be described as a "Data Buffer;" block 206 may be described as a "Output Data Path with Functional Mask;" block 208 may be described as a "Write Entry Pointer;" and block 210 may be described as a "Read Entry Pointer." It is noted that the RTL description 200 is merely an example provided for purposes of illustration. Thus, for brevity, the functionality (i.e., behavior) of each of the blocks 202-210 is briefly described, and only the RTL descriptions of blocks 208 and 210 (i.e., the Write Entry Pointer and the Read Entry Pointer) are shown in FIG. 2 and reproduced below.

In some embodiments, the 4×4 Data Array (block 202) includes sixteen data cells (202-1, 202-2, 202-3, 202-4, 202-5, 202-6, 202-7, 202-8, 202-9, 202-10, 202-11, 202-12, 202-13, 202-14, 202-15, and 202-16) arranged in a four-by-four array (i.e., 4 columns×4 rows), and each of the data cells is configured to logically store a data bit. The Data Buffer (block 204) is configured to sequentially receive plural batches of data bits to be written into the 4×4 Data Array 202. For example, each batch of data bits may include four data bits, wherein each data bit is configured to be written to a respective data cell on a row of a particular column of the 4×4 Data Array 202. The Output Data Path with Functional Mask (block 206) is configured to sequentially receive plural batches of read data bits from the 4×4 Data Array 202, and further provide a filtering function on each of the batches of read data bits. As a non-limiting example, for every batch of read data bits that the Output Data Path with Functional Mask 206 receives from the 4×4 Data Array 202, e.g., four read data bits, the Output Data Path with Functional Mask 206 may filter out second and fourth read data bits as logical 0's.

The Write Entry Pointer (block 208) is configured to sequentially write the batch of data bits received at the Data Buffer 204 to one selected column of the 4×4 Data Array 202 based on a clock signal. The Write Entry Pointer 208's RTL description is reproduced below:

```
WritePointer Function (wr_ptr)
    Initial wr_ptr = 0;
    When (WriteEnable & NotReset) {
        if (wr_ptr ==4)
            {wr_ptr = 0;}
        else {wr_ptr = wr_ptr+1;}}
```

In the RTL description of the Write Entry Pointer 208, variable "wr_ptr" may represent the selected column to be written, and such a variable wr_ptr is one of various above-mentioned internal operation values that will be "captured" and "mapped" in the following discussions; and variable "WriteEnable" may represent one of various above-mentioned input/output (I/O) variables that will also be "captured" for a later use.

More specifically, in some embodiments, the RTL description of the Write Entry Pointer 208, provided above, is a high-level description of a procedure defining how an address-pointer (e.g., wr_ptr) is generated and how the address-pointer is incremented by 1 at a time based on counter-base logic. It is noted that above RTL description of the Write Entry Pointer 208 is merely an example provide for illustration. Thus, the above-provided RTL description of the Write Entry Pointer 208 is briefly described as follows: a) "WritePointer Function (wr_ptr)" is configured to cause the Write Entry Pointer 208 to perform a counter-like procedure to increment each count, which is reflected to a selected column of the 4×4 Data Array 202 to be written; b) "Initial wr_ptr=0" is configured to mimic an initial state of a counter event, which is typically set to 0; c) "When (WriteEnable & NotReset) { }" is a logic operation that only executes the instructions within "{ }" when the below conditions are met: (i) "WriteEnable" is a logical 1 and (ii) the Write Entry Pointer 208 is not in a reset state; and d) "if (wr_ptr==4) {wr_ptr=0;}" is configured to execute the if instruction when "wr_ptr" has been accumulated to a desired limit, e.g., 4 in this example and subsequently the "wr_ptr" is reset to 0 so as to start counting from 0 again.

The Read Entry Pointer (block 210) is configured to sequentially read the data bits stored in one selected column of the 4×4 Data Array 202 so as to provide the read data bits to the Output Data Path with Functional Mask 206 based on the same clock signal driving the Write Entry Pointer 208. The Read Entry Pointer 210's RTL description is reproduced below:

```
ReadPointer Function (rd_ptr)
    Initial rd_ptr = 0;
    When (ReadEnable & NotReset) {
        if (rd_ptr ==4)
            {rd_ptr = 0;}
        else {rd_ptr = rd_ptr+1;}}
```

In the RTL description of the Read Entry Pointer 210, variable "rd_ptr" may represent the selected column to be read, and such a variable rd_ptr is one of various above-mentioned internal operation values that will be "captured" and "mapped" in the following discussions; variable "ReadEnable" may represent one of various above-mentioned input/output (I/O) variables that will also be "captured" for a later use. The RTL description of the Read Entry Pointer 210 is substantially similar to the RTL description of the Write Entry Pointer 208 as discussed above, so that, for purposes of brevity, the discussion of the Read Entry Pointer 210 is omitted.

Figure 3A:
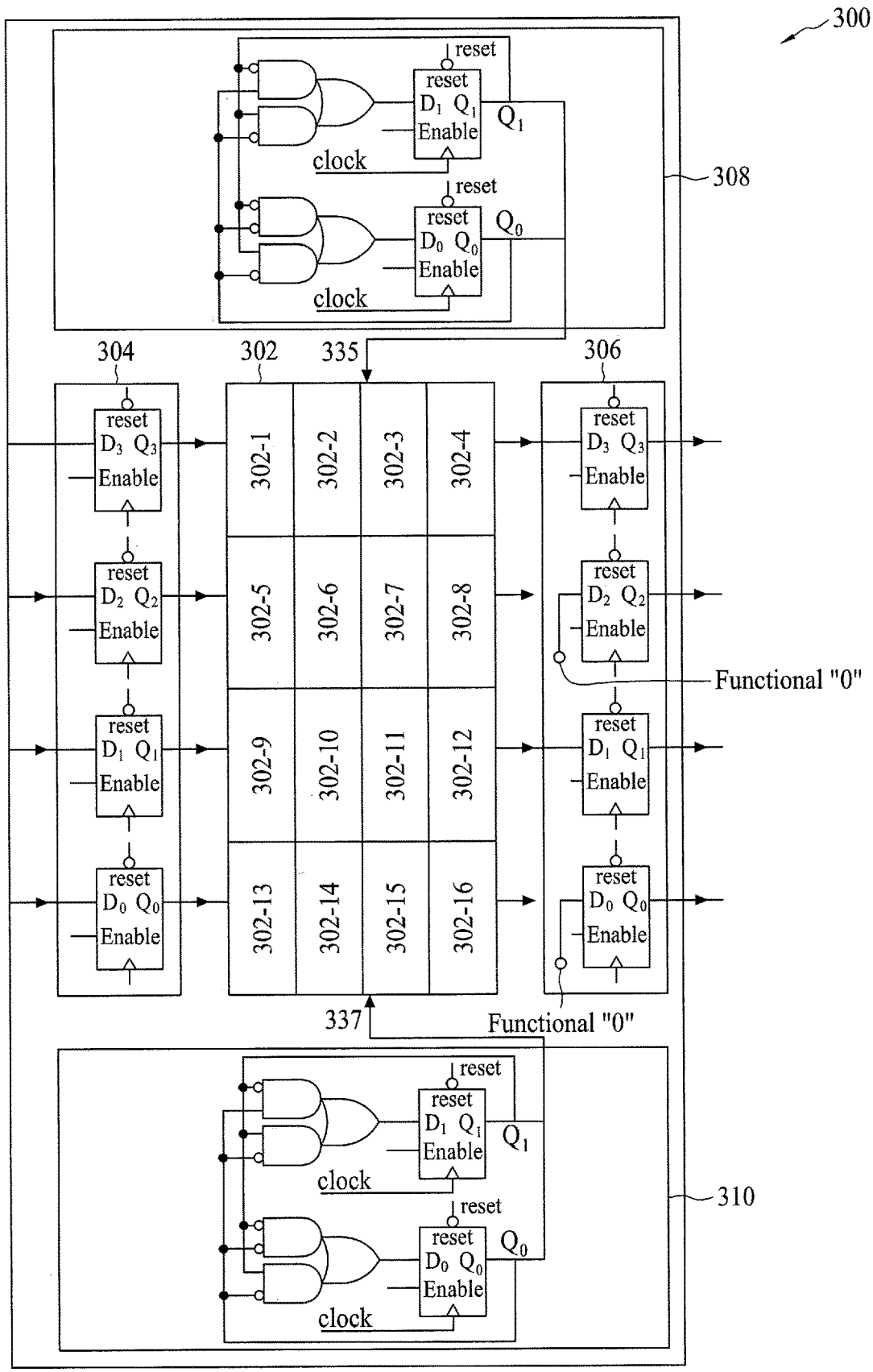
FIG. 3A illustrates an exemplary gate-level netlist of the IC design provided by the method of FIG. 1, in accordance with some embodiments.

Corresponding to operation 104, FIG. 3A illustrates an exemplary gate-level netlist 300 based on the synthesis of the RTL description 200 of the memory circuit, in accordance with some embodiments. In general, a process of translating an RTL description into a gate-level netlist is referred to as "synthesis." As mentioned above, a gate-level netlist of an IC includes a set of interconnecting logic gates such as AND, OR gates and memory components such as flip-flops that is used to define the IC. One or more tools may be used to perform the synthesis such as, for example, Design Compiler (Synopsys of Mountain View, Calif.), Encounter RTL Compiler (Cadence Design Systems of San Jose, Calif.), etc.

Figure 3B:
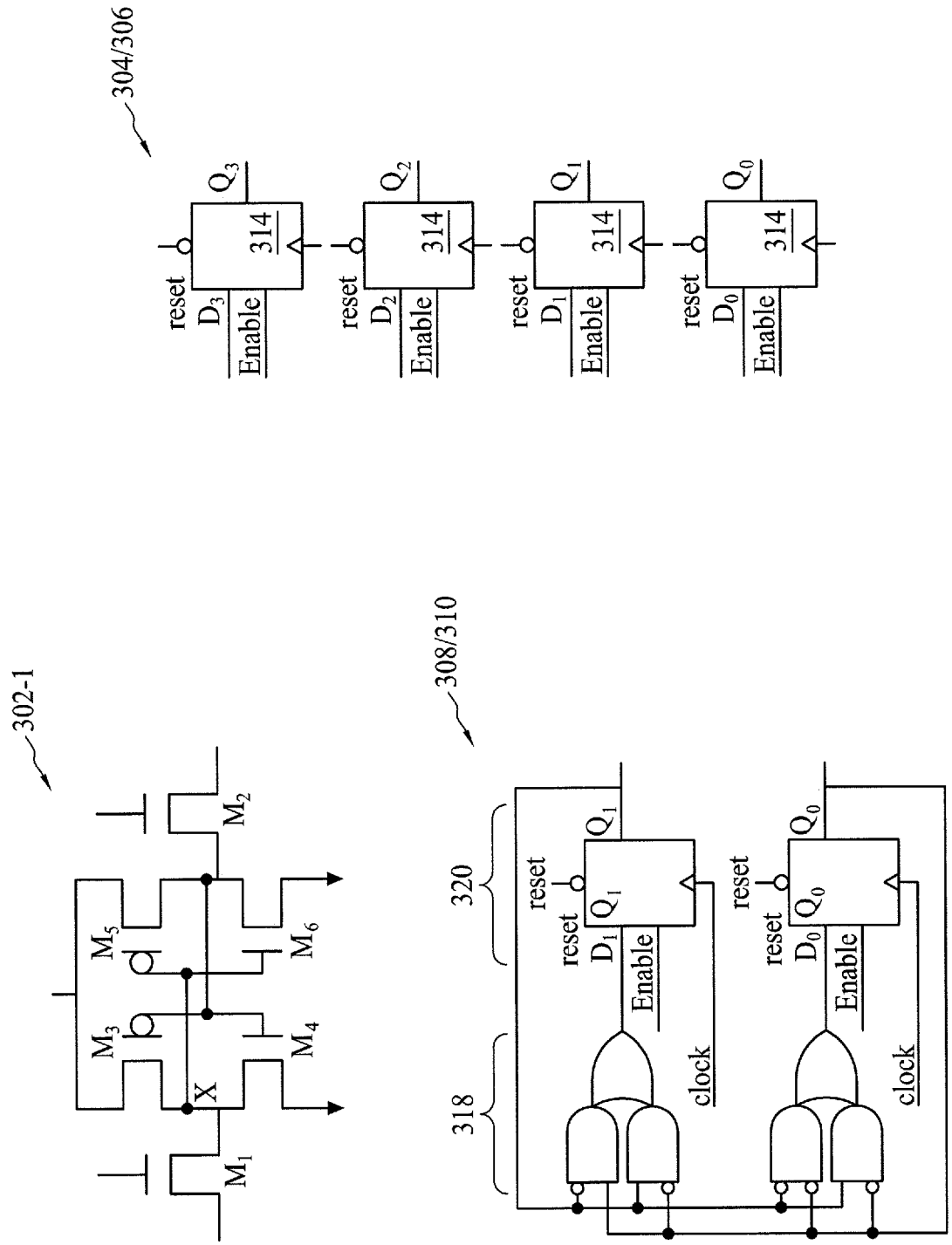
FIG. 3B illustrates plural exemplary logic circuits of the gate-level netlist of FIG. 3A, in accordance with some embodiments.

Based on the "behavioral" descriptions of the RTL description 200, in some embodiments, the RTL description 200 may be synthesized (e.g., translated) to provide the gate-level netlist 300 as shown in FIG. 3A. More particularly, each descriptive block 202, 204, 206, 208, and 210 of the RTL description 200 may be synthesized as a respective memory array 302 or a logic circuit 304, 306, 308, and 310 that each includes a combination of transistors/logic gates/flip-flops as shown in FIG. 3B. More specifically, the 4×4 Data Array 202 may be synthesized as the memory array 302; the Data Buffer 204 may be synthesized as the logic circuit 304; the Output Data Path with Functional Mask 206 may be synthesized as the logic circuit 306; the Write Entry Pointer 208 may be synthesized as the logic circuit 308; and the Read Entry Pointer 210 may be synthesized as the logic circuit 310.

In some embodiments, the memory array 302 include an array of memory bit cells: 302-1, 302-2, 302-3, 302-4, 302-5, 302-6, 302-7, 302-8, 302-9, 302-10, 302-11, 302-12, 302-13, 302-14, 302-15, and 302-16, wherein the memory bit cells 302-1 to 302-16 each corresponds to a respective data cell of the 4×4 Data Array 202. As a representative example, an embodiment of the memory bit cell 302-1 is shown in FIG. 3B. The illustrated embodiment of the memory bit cell 302-1, in FIG. 3B, includes a 6T (six-transistor) memory bit cell, wherein NMOS transistors M1 and M2 function as access transistors of the memory bit cell 302-1, PMOS transistor M3 and NMOS transistor M4 function as a first inverter, PMOS transistor M5 and NMOS transistor M6 function as a second inverter, and the first and second inverters are cross-coupled with each other. Referring still to FIG. 3B, the logic circuit 304/306 includes four substantially similar flip-flops 314 (e.g., D flip-flops, SR flip-flops, T flip-flops, JK flip-flops, etc.); and the logic circuit 308/310 includes one or more combinations of logic gates 318 (e.g., AND gates, OR gates, NAND gates, NOR gates, etc.) and flip-flops 320 (e.g., D flip-flops, SR flip-flops, T flip-flops, JK flip-flops, etc.). Again, it is understood that the circuits of FIGS. 3A and 3B are merely representative examples provided for the purpose of illustrating various concepts and features of the disclosure.

More particularly, in the RTL description 200 (FIG. 2), the 4×4 Data Array 202, the Data Buffer 204, the Output Data Path with Functional Mask 206, the Write Entry Pointer 208, and the Read Entry Pointer 210 are defined to perform respective functionalities with respect to one another, as mentioned above. As such, the gate-level netlist 300 may interconnect the memory array 302 and the logic circuits 304-310 with respect to one another to perform the respective functionalities, accordingly.

For example, each flip-flop of the logic circuit 304 (the Data Buffer 204 in the RTL description 200) is coupled to four memory bit cells that are deployed in four respective columns of the memory array 302, and the logic circuit 308

(the Write Entry Pointer 208 in the RTL description 200) is coupled to the memory array 302 so as to allow the data bit received at each flip-flop's input of the logic circuit 304 to be provided to one of the four memory bit cells according to which column the logic circuit 308 selects. Also, each flip-flop of the logic circuit 306 (the Output Data Path with Functional Mask 206 in the RTL description 200) is coupled to four memory bit cells that are deployed in four respective columns of the memory array 302, and the logic circuit 310 (the Read Entry Pointer 210 in the RTL description 200) is coupled to the memory array 302 so as to allow the data bit that is read from one of the four memory bit cells according to which column the logic circuit 310 selects to be received at a respective flip-flop's input of the logic circuit 306. Further, as mentioned above, the Output Data Path with Functional Mask 206 (FIG. 2) is configured to filter out second and fourth read data bits as logical 0's. Thus, in some embodiments, inputs of second and fourth flip-flops of the logic circuit 306, i.e., $D_2$ and $D_0$, may be tied to a "Functional 0," as shown in FIG. 3A. As such, although the second and fourth flip flops of the logic circuit 306 receives data bits read from the memory bit cells on second and fourth rows of the memory array 302 (e.g., memory bit cells 302-5 to 302-8 and 302-13 to 302-16), which may be logical 1 or 0, the second and fourth flip-flops of the logic circuit may still provide respective outputs (i.e., $Q_0$ and $Q_2$) as logical 0's.

Corresponding to operation 106, in some embodiments, upon the synthesis of the gate-level netlist 300, a plurality of RTL-to-gate-level (RtG) mapping details bridging the RTL description 200 and the gate-level netlist 300 are readily available. For example, FIG. 4 symbolically illustrates how each of the RtG mapping details translates a variable of the RTL description 200 into a respective (gate-level) node of the gate-level netlist 300, in accordance with some embodiments.

More specifically, in accordance with some embodiments, exemplary RtG mapping details are discussed as follows. A plurality of input and output variables of the Data Buffer 204, symbolically shown as "205" and "207," respectively, correspond to input nodes and output nodes "305" and "307" of the flip-flops (e.g., 314) of the logic circuit 304, respectively. A data bit (not shown) stored in each data cell of the 4×4 Data Array 202 corresponds to a data bit (not shown) stored in the corresponding memory bit cell of the memory array 302. As a representative example, the data bit stored in the data cell 202-1 corresponds to the data bit stored in the memory bit cell 302-1. More specifically, in the example where the memory bit cell 302-1 is implemented as the 6T bit cell (FIG. 3B), the data bit stored in the memory bit cell 302-1 may correspond to node "X," as shown in FIG. 3B.

Figure 4:
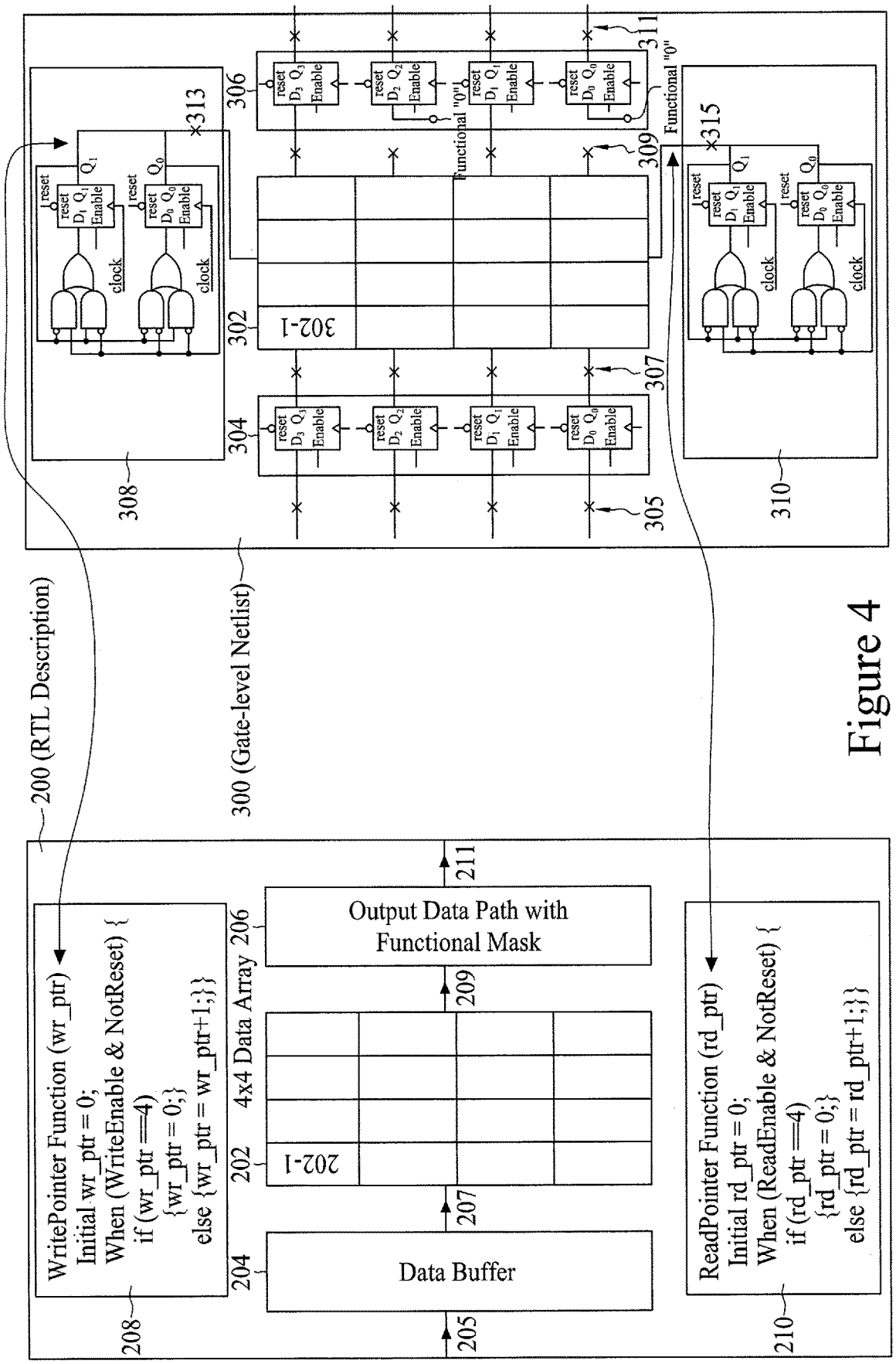
FIG. 4 illustrates exemplary RTL-to-gate-level (RtG) details provided by the method of FIG. 1, in accordance with some embodiments.

Referring still to FIG. 4, a plurality of output variables of the 4×4 Data Array 202, symbolically shown as "209," corresponds to output nodes "309" of the memory cell array 302. Since the output of the 4×4 Data Array 202 is also coupled to the Output Data Path with Functional Mask 206, such output nodes 309 of the memory cell array 302 also correspond to input nodes of the flip-flops (e.g., 314) of the logic circuit 306. A plurality of output variables of the Output Data Path with Functional Mask 206, symbolically shown as "211," corresponds to output nodes 311 of the flip-flops (e.g., 314) of the logic circuit 306. The variable "wr_ptr" of the Write Entry Pointer 208 corresponds to output node 313 of the logic circuit 308, while the variable "rd_ptr" of the Read Entry Pointer 210 corresponds to output node 315 of the logic circuit 310, as shown in FIG. 4.

Figure 5:
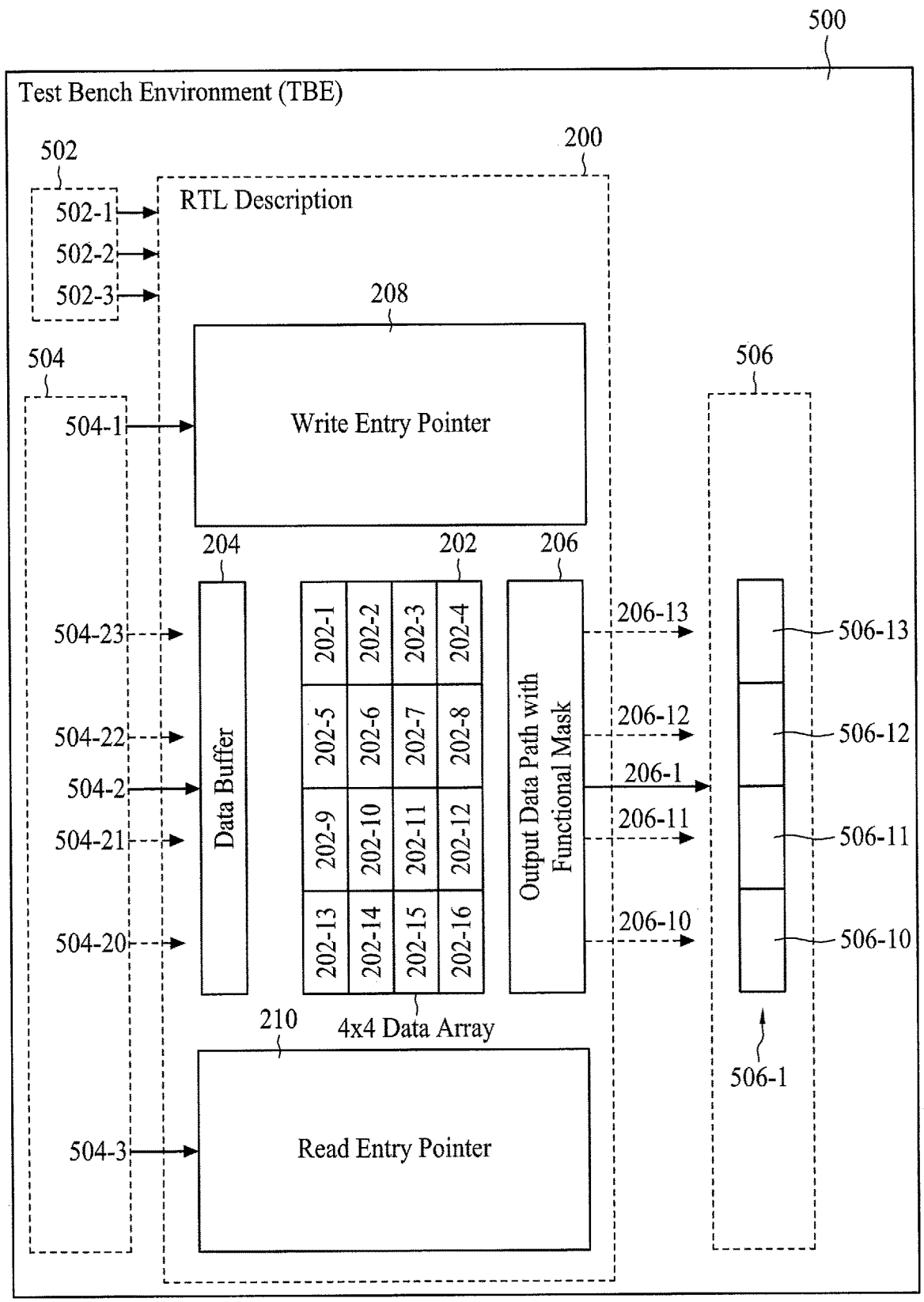
FIG. 5 illustrates an exemplary test bench environment (TBE) provided by the method of FIG. 1, in accordance with some embodiments.

Corresponding to operation 108, FIG. 5 symbolically illustrates how the RTL description 200 is simulated to provide an exemplary test bench 500, in accordance with some embodiments. The term "test bench," as used herein, refers to a virtual environment configured to verify correctness or soundness of a circuit design or model such as, for example, the RTL description 200 of the memory circuit. Thus, for clarity, the test bench 500 is hereinafter referred to as "test bench environment (TBE) 500."

As shown in FIG. 5, in some embodiments, the TBE 500 includes three functional blocks: a first block 502 that is configured to provide a clock signal 502-1, a chip enable signal 502-2, and a reset signal 502-3 to drive a simulated operation of the RTL description 200; a second block 504 that is configured to provide a write enable signal 504-1 to the Write Entry Pointer 208 to enable one or more write operations, a data array signal 504-2 to the Data Buffer 204, and a read enable signal 504-3 to the Read Entry Pointer 210 to enable one or more read operations; and a third block 506 that is configured to monitor output signal 206-1 provided by the Output Data Path with Functional Mask 206 by comparing the output signal 206-1 to a pre-determined signal 506-1 so as to determine or verify whether the simulated operation of the RTL description 200 is "as expected."

Similar to the RTL description 200, in some embodiments, the TBE 500 may be implemented by a software program that is typically written in procedural programming languages such as C, C++, Verilog, and VHDL to define the respectively functional blocks 502, 504, and 506. Accordingly, the signals (e.g., 502-1, 502-2, 502-3, 504-1, 504-2, 504-3, 506-1, etc.) respectively provided or received by the functional blocks 502, 504, and 506 may be each described as an input/output (I/O) variable (hereinafter "I/O variable").

In some embodiments, some of such I/O variables in the TBE 500 may function as "stimulus" for driving the RTL description 200. Alternatively stated, by deploying the RTL description 200 in the TBE 500 and applying the I/O variables (e.g., 502-1, 502-2, 502-3, 504-1, 504-2, 504-3, 506-1, etc.) to the RTL description 200, a test bench result simulating the operations of the RTL description 200 may be available, which will be discussed below with respect to FIGS. 6A and 6B.

As mentioned above, the functional block 506 of the TBE 500 is configured to monitor output signal 206-1 provided by the Output Data Path with Functional Mask 206 to determine or verify whether the simulated operation of the RTL description 200 is as expected. In some embodiments, before performing the test bench simulation, the functional block 506 may be programmed (e.g., written in Verilog) to correspond with the functional block 504. More specifically, the functional block 504 provides the data array signal 504-2 to the RTL description 200. After the RTL description 200 processes the data array signal 504-2, the functional block 506 is configured to receive the output signal 206-1 that is as expected as the pre-determined signal 506-1 according to the data array signal 504-2 and the operation of the RTL description 200. If the output signal 206-1 is not as expected (i.e., not equal to the signal 506-1), in some embodiments, the TBE 500 may raise an alarm flag. If the output signal 206-1 is as expected (i.e., equal to the signal 506-1), the TBE 500 may recognize the RTL description 200 as a "passed" design. In some embodiments, the data array signal 504-2 includes four sub-signals 504-20, 504-21, 504-22, 504-23 (shown in dotted arrows) that each represents a data bit to be written to data cells along a corresponding row of the 4×4 Data Array 202, and the output signal 206-1 includes four sub-signals 206-10, 206-11, 206-12, and 206-13 (shown in dotted arrows) that each represents a data bit to be read out from data cells along a corresponding row of the 4×4 Data Array 202 and further filtered by the Output Data Path with Functional Mask 206, both of which will be discussed in further detail below.

Figure 6A:
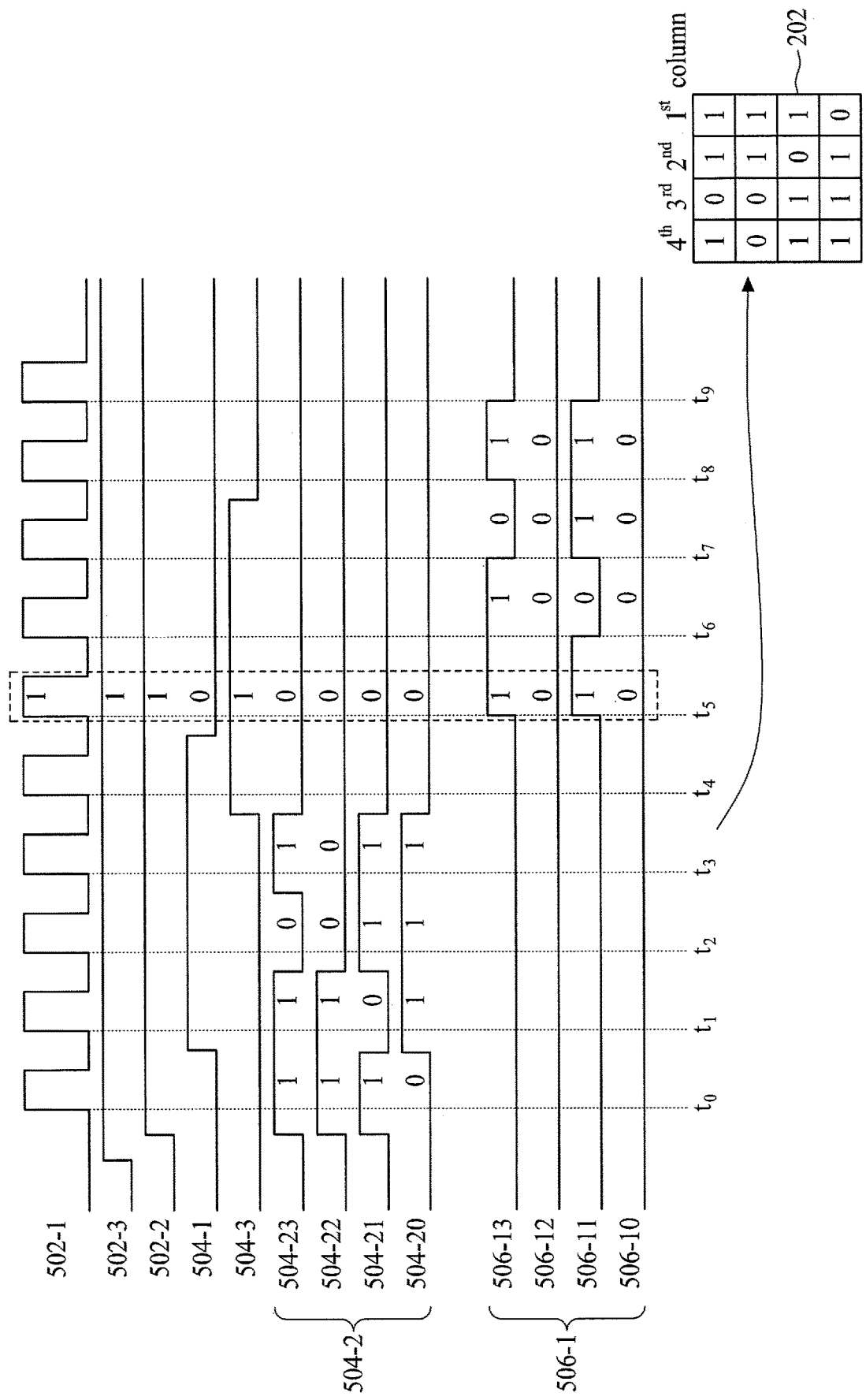
FIG. 6A illustrates exemplary waveforms of plural input/output (I/O) variables used in the TBE of FIG. 5, in accordance with some embodiments.
Figure 6B:
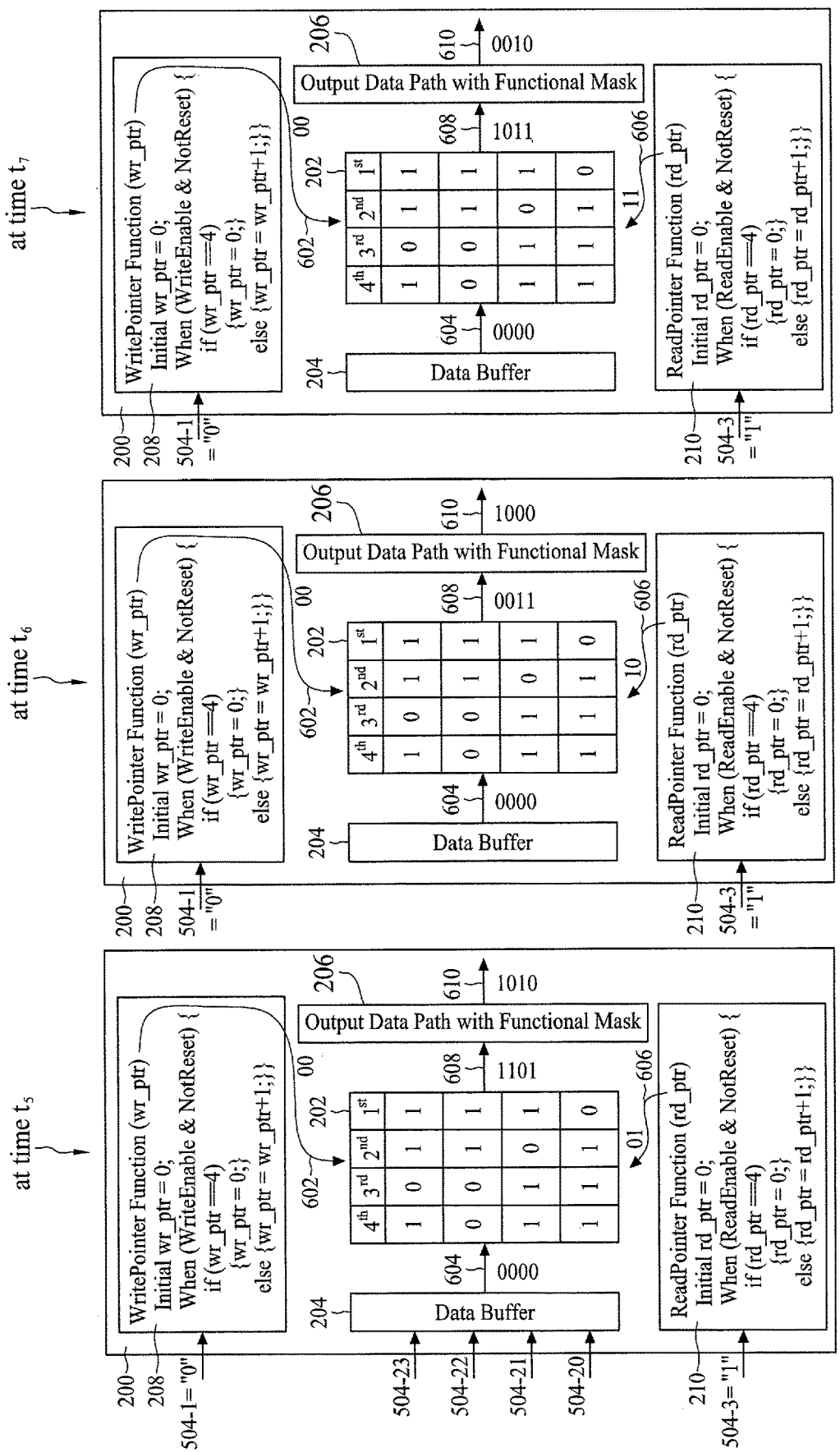
FIG. 6B illustrates plural exemplary internal operation values used in the TBE of FIG. 5, in accordance with some embodiments.

Corresponding to operation 110, FIG. 6A illustrates exemplary waveforms of the I/O variables 502-1, 502-2, 502-3, 504-1, 504-2, 504-3, 506-1, and FIG. 6B illustrates some exemplary internal operation values of the RTL description 200 at some particular times during a full-scale test bench simulation performed on the RTL description 200, in accordance with some embodiments. As mentioned above, the term "full-scale simulation" refers to such a simulation including all operations phases of the corresponding circuit design. Although the illustrated embodiment of FIG. 6A includes 10 cycles (i.e., from time "t0" to time "t9") to finish a full-scale test bench simulation on the RTL description 200, it should be noted that it is merely an example for illustration purposes. Alternatively stated, the full-scale test bench simulation on the RTL description 200 may include any desired number of cycles. Moreover, in some alternative embodiments, there may be a fraction of all the operations phases, i.e., a non-full-scale test bench simulation, that are simulated in such a test bench simulation on the RTL description 200 of operation 110 (FIG. 1).

Referring again to FIG. 6A, each waveform of the I/O variables 502-1, 502-2, 502-3, 504-1, 504-2, 504-3, 506-1 oscillates between a logical 1 (hereinafter "HIGH") and a logical 0 (hereinafter "LOW") over time. As mentioned above, the data array signal 504-2 includes four sub-signals 504-20, 504-21, 504-22, 504-23 that each represents a data bit to be written to data cells along a corresponding row of the 4×4 Data Array 202 (FIG. 5). It is also noted that the output signal 506-1 includes four sub-signals 506-10, 506-11, 506-12, 506-13 that each represents a data bit to be compared with a data bit (e.g., 206-10, 206-11, 206-12, or 206-13) read from data cells along a corresponding row of the 4×4 Data Array 202 and further filtered out by the Output Data Path with Functional Mask 206 (FIG. 5).

For example, sub-signal 504-20 represents the data bit to be sequentially written to the data cells 202-13, 202-14, 202-15, and 202-16, respectively; sub-signal 504-21 represents the data bit to be sequentially written to the data cells 202-9, 202-10, 202-11, and 202-11, respectively; sub-signal 504-22 represents the data bit to be sequentially written to the data cells 202-5, 202-6, 202-7, and 202-8, respectively; and sub-signal 504-23 represents the data bit to be sequentially written to the data cells 202-1, 202-2, 202-3, and 202-4, respectively. Similarly, sub-signal 506-10 represents the data bit to be compared with the data bit sequentially read from the data cells 202-16, 202-15, 202-14, and 202-13, respectively; sub-signal 506-11 represents the data bit to be compared with the data bit sequentially read from the data cells 202-12, 202-11, 202-10, and 202-9, respectively; sub-signal 506-12 represents the data bit to be compared with the data bit sequentially read from the data cells 202-8, 202-7, 202-6, and 202-5, respectively; and sub-signal 506-13 represents the data bit to be compared with the data bit sequentially read from the data cells 202-4, 202-3, 202-2, and 202-1, respectively.

In some embodiments, the full-scale test bench simulation, performed by the TBE 500, starts at time t0. Prior to time t0, the TBE 500 asserts the chip enable signal 502-2 and the reset signal 502-3 to HIGH so as to enable the operation of the memory circuit of the RTL description 200. Also prior to time t0, the TBE 500 provides a first batch of data bits (504-20 to 504-23) to the Data Buffer 204. As shown in FIG. 6A, prior to time t0, the data bits 504-20 to 504-23 transition from logical 0 to logical 0, 1, 1, 1, respectively. After time t0, the TBE 500 asserts the write enable signal 504-1 to HIGH to enable the Write Entry Pointer 208 such that the first batch of data bits (504-20 to 504-23), logical 0, 1, 1, 1, can be written to data cells 202-16, 202-12, 202-8, and 202-4 (i.e., the first column of the 4×4 Data Array 202), respectively. Similarly, with the write enable signal 504-1 being at HIGH, second, third, and fourth batches of data bits (504-20 to 504-23) may be subsequently written to second column (data cells 202-15, 202-11, 202-7, and 202-3), third column (data cells 202-14, 202-10, 202-6, and 202-2), and fourth column (data cells 202-13, 202-9, 202-5, and 202-1) of the 4×4 Data Array 202 after times t1, t2, and t3, respectively. For purposes of clarity, between times t3 and t4, the data bits present at the 4×4 Data Array 202 are also illustrated in FIG. 6A.

In some embodiments, between times t3 and t4, the TBE 500 may determine that the data bits present at the 4×4 Data Array 202 may be subsequently read out so that the TBE 500 asserts the read enable signal 504-3 to HIGH to enable the Read Entry Pointer 210. As such, the data bits written to the 4×4 Data Array 202 can be read out. As mentioned above, according to some embodiments, the Output Data Path with Functional Mask 206 is configured to filter out the received second and fourth bits as logical 0's. Based on such operations of the RTL description 200, in some embodiments, at time t5, the TBE 500 may expect a first batch of data bits received from the Output Data Path with Functional Mask 206 (i.e., the data bits stored at the first column of the 4×4 Data Array 202) to be logical 1010. Accordingly, at time t5, the TBE 500 may determine sub-signals 506-13, 506-12, 506-11, and 506-10 as logical 1010, as shown in FIG. 6A. Similarly, the TBE 500 may determine sub-signals 506-13, 506-12, 506-11, and 506-10 as logical 1000, 0010, and 1010 at times t6, t7, and t8, respectively.

Referring to FIG. 6B, a plurality of exemplary internal operation values (602, 604, 606, 608, and 610) at times t5, t6, and t7 are shown when the RTL description 200 is undergoing a full-scale test bench simulation, in accordance with some embodiments. For clarity, only a portion of the full-scale test bench simulation (i.e., at times t5, t6 and t7) is shown in FIG. 6B. In some embodiments, the internal operation value 602 corresponds to the variable "wr_ptr" of the Write Entry Pointer 208, which points to or selects a column of the Data Array 200 to be written; the internal operation value 604 represents the batch of data bits provide by the Data Buffer 204; the internal operation value 606 corresponds to the variable "rd_ptr" of the Read Entry Pointer 210, which points to or selects a column of the Data Array 202 to be read; the internal operation value 608 represents the batch of data bits read from the 4×4 Data Array 202 and received by the Output Data Path with Functional Mask 206; and the internal operation value 610 represents the batch of data bits filtered by the Output Data Path with Functional Mask 206.

Referring still to FIG. 6B and in conjunction with FIG. 6A, at time t5, the write enable signal 504-1 is asserted to LOW so that the internal operation value 602 may be kept as LOW (logical 00). And since the data array signals 504-20 to 504-23 provided by the TBE 500 are at LOW (logical 0000), the internal operation value 604 may be at LOW (logical 0000) as well. On the other hand, the read enable signal 504-3 is asserted to HIGH so that the internal operation value 606 may vary over time. For example, at time t5, the internal operation value 606 may correspond to logical 01, which causes the data bits stored at the second column of the 4×4 Data Array 202 to be read. Accordingly, the internal operation value 608 may correspond to logical 1101 (the data bits stored at the second column of the 4×4 Data Array 202). Through the filtering function of the Output Data Path with Functional Mask 206, the internal operation value 610 may be output as logical 1000 at a later time (e.g., time t6). Thus, it is noted that at time t5, the internal value 610 may reflect filtered data bits that were originally read out from the first column of the 4×4 Data Array 202, i.e., logical 1110, and after being filtered by the Output Data Path with Functional Mask 206, the internal value 610 is logical 1010. Similarly, at time t6, the internal operation values 602, 604, 606, 608, and 610 may be logical: 00, 0000, 10 (to read the third column of the 4×4 Data Array 202), 0011 (the data bits stored at the third column of the 4×4 Data Array 202), 1000 (the filtered data bits that were originally read out from the second column of the 4×4 Data Array 202), respectively. And at time t7, the internal operation values 602, 604, 606, 608, and 610 may be logical: 00, 0000, 11 (to read the fourth column of the 4×4 Data Array 202), 1011 (the data bits stored at the fourth column the 4×4 Data Array 202), 0010 (the filtered data bits that were originally read out from the third column of the 4×4 Data Array 202), respectively.

As mentioned above, the overall performance of an IC may be dominated by one or more operations phases, and an accurate simulation result, performed on a gate-level netlist, for each of such particular operation phases is generally desirable to provide reliable performance estimation of the IC. In the current example of the memory circuit designed based on the RTL description 200 described above, a user (e.g., a manufacturer, a vendor, a consumer of the memory circuit, etc.) may be interested in the performance of the memory circuit during one or more specified times (e.g., t5-t8). Conventional gate-level (test bench) simulations require a full-scale simulation (i.e., from time t0 to time t9) to be performed on the gate-level netlist of the memory circuit (i.e., 300 of FIG. 3A/4). Although a number of gate-level nodes (e.g., 305, 307, 309, 311, 313, 315, etc.) of the exemplary netlist 300 is limited, it is understood by people of ordinary skill in the art that a modern SoC circuit generally includes up to billions of such gate-level nodes, which makes a corresponding gate-level simulation very time-/resource-consuming. However, by specifying a desired period of time (e.g., operation 112 of FIG. 1A), some embodiments of the present disclosure use the above-discussed operations 114, 116, and 118 of method 100 (FIGS. 1A and 1B) to perform a gate-level test bench simulation only on the specified period of time, e.g., t5-t8, which may greatly decrease the amount of time and/or resource to finish such gate-level test bench simulation. Each of the operations 114 to 118 will be discussed in further detail below in the context of the memory circuit discussed in FIGS. 2 through 6B above.

Corresponding to operation 114 of FIG. 1, after identifying a specified period of time at operation 112 (e.g., from time t5 to time t8), which is less than a period of time required to perform a full-scale simulation, a snapshot including a plurality of internal operation values (including the data bits stored in the 4×4 Data Array 202) of the RTL description 200 at the beginning time of the specified period of time, e.g., time t5, is captured. Such a snapshot is symbolically illustrated in FIG. 6B. To recap, at time t5, the internal operation values 602, 604, 606, 608, and 610 may be logical: 00 (write operation being disabled), 0000, 01 (to read the second column of the 4×4 Data Array 202), 1101 (the data bits stored at the second column the 4×4 Data Array 202), and 1010 (the data bits read out from the first column of the 4×4 Data Array 202 and filtered by the Output Data Path with Functional Mask 206), respectively, and the data bits stored in the 4×4 Data Array 202 are shown in FIG. 6B.

Subsequently, corresponding to operation 116, the captured internal operation values 602, 604, 606, 608, 610, and data bits in the 4×4 Data Array 202 are each mapped to corresponding gate-level nodes of the netlist 300 using the RtG mapping details (FIG. 4). More specifically, as shown in the gale-level netlist 300 of FIG. 7, the captured internal operation value 602 (e.g., logical 00) is mapped to the node 313; the captured internal operation value 604 (e.g., logical 0000) is mapped to the nodes 307; the captured internal operation value 606 (e.g., logical 01) is mapped to the node 315; the captured internal operation value 608 (e.g., logical 1101) is mapped to the nodes 309; the captured internal operation value 610 (e.g., logical 1010) is mapped to the nodes 311; and the data bits stored in the 4×4 Data Array 202 are each mapped to corresponding memory bit cell (e.g., 302-1) of the memory array 302.

Figure 8:
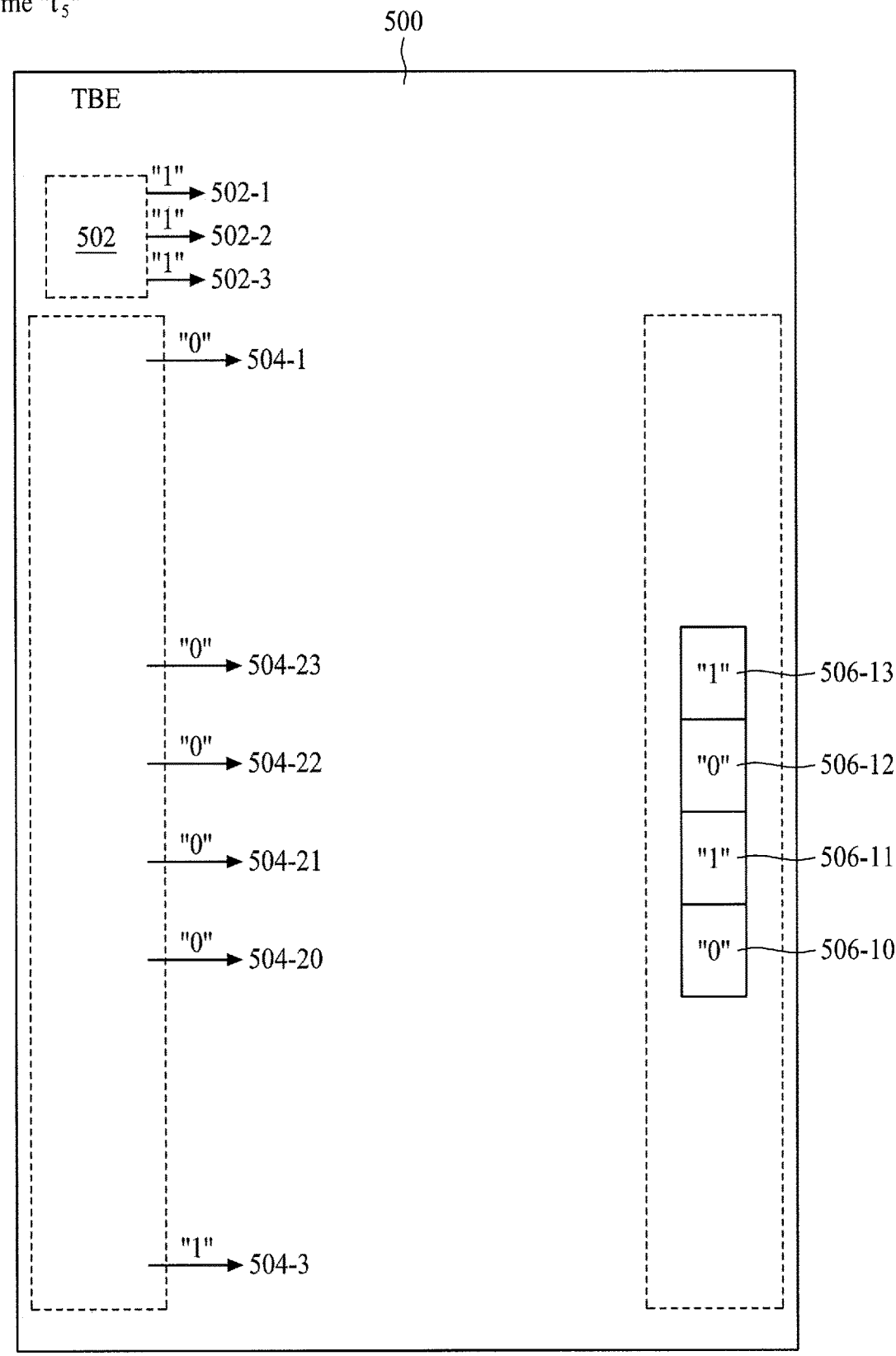
FIG. 8 illustrates an exemplary TBE with captured I/O variables at a specific time provided by the method of FIG. 1, in accordance with some embodiments.

Subsequently, corresponding to operation 118, a plurality of I/O variables (502-1 to 502-3, 504-1 to 504-3, and 506-1) of the TBE 500 (performed on the RTL description 200) at the beginning time of the specified period of time, e.g., time t5, are captured. As such, the TBE 500 may be "customized" for simulating the gate-level netlist 300 that starts from time t5. More specifically, at time t5, as shown in FIG. 8, the I/O variables 502-1, 502-2, 502-3, 504-1, 504-2 (504-20, 504-21, 504-22, 504-23), 504-3, and 506-1 (506-10, 506-11, 506-12, 506-13) are captured as logical: 1, 1, 1, 0, 0000, 1, and 0101, respectively.

Figure 7:
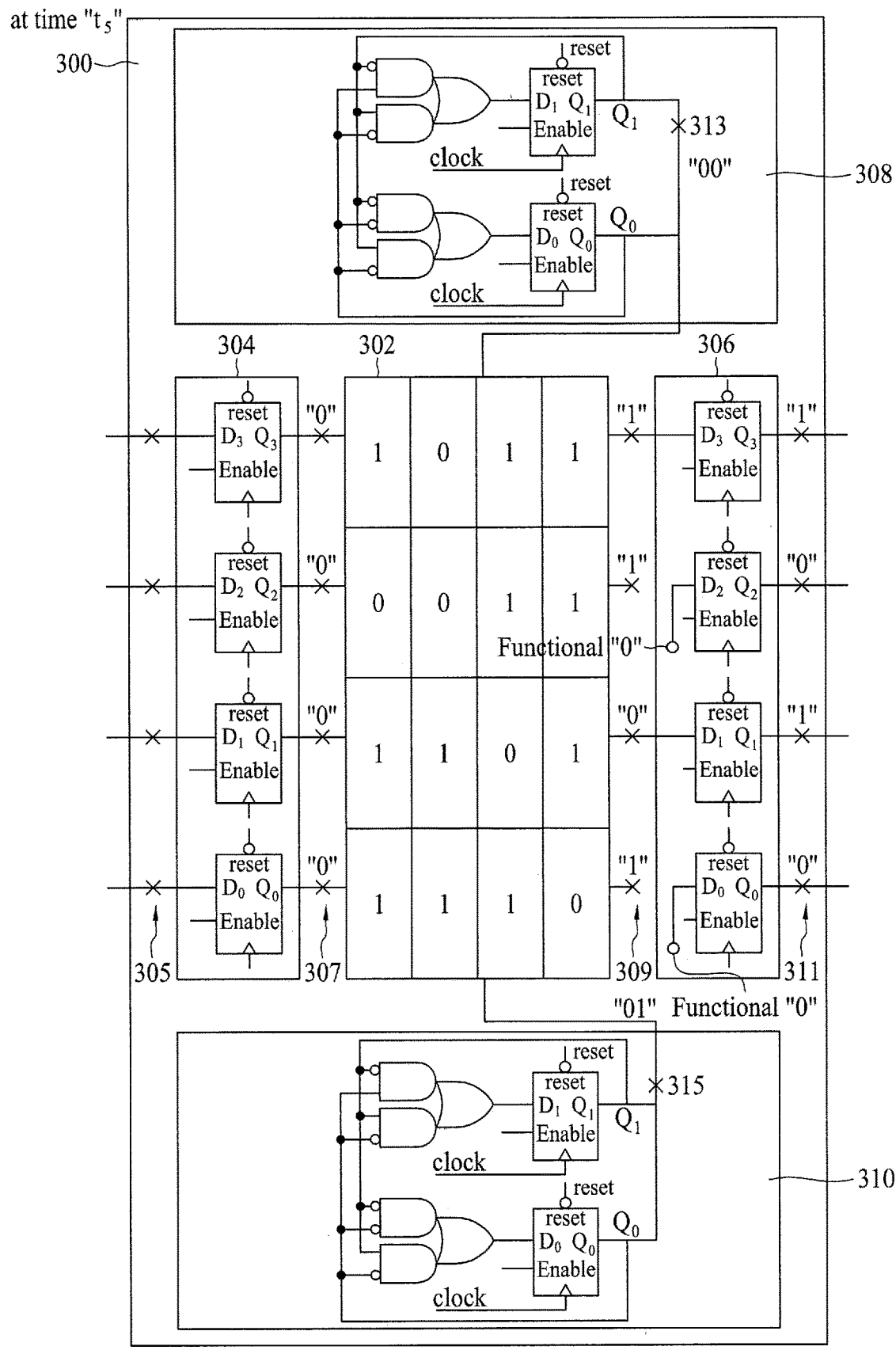
FIG. 7 illustrates an exemplary gate-level netlist with captured-and-mapped internal operation values at a specific time provided by the method of FIG. 1, in accordance with some embodiments.

In some embodiments, by deploying the gate-level netlist 300 with the captured internal operation values (FIG. 7) into such a customized test bench environment (FIG. 8), a gate-level test bench simulation on the gate-level netlist 300 only for the specified period of time can be realized. More specifically, those captured I/O variables (now becoming I/O values) are then used as stimulus to perform a gate-level test bench simulation (operation 120 of FIG. 1), starting from time t5, on the gate-level netlist 300 with the captured internal operation values (FIG. 7). In other words, such a gate-level test bench simulation can be initiated at the beginning time of the specified period of time (e.g., time t5 in the example above) with the captured internal operation values and captured I/O values, continuously run without capturing internal operation values and I/O variables at other times during the specified period of time (e.g., time t6, t7, or t8), and stopped at an end of specified period of time (e.g., time t8) by providing an ending instruction.

Various gate-level logic simulation tools may be used to perform such a gate-level test bench simulation such as, for example, VCS (Synopsys of Mountain View, Calif.). Accordingly, one or more files (e.g., a value change dump (VCD) file) that include toggling information of each gate-level node of the gate-level netlist 300 during the specified period of time may be generated. By using generated VCD file, one or more performance characteristics (e.g., power consumption) of the original memory circuit design (from which the gate-level netlist 300 is generated) can be accurately estimated by using various estimation tools (operation 122) such as, for example, Power Compiler (Synopsys of Mountain View, Calif.).

Figure 9:
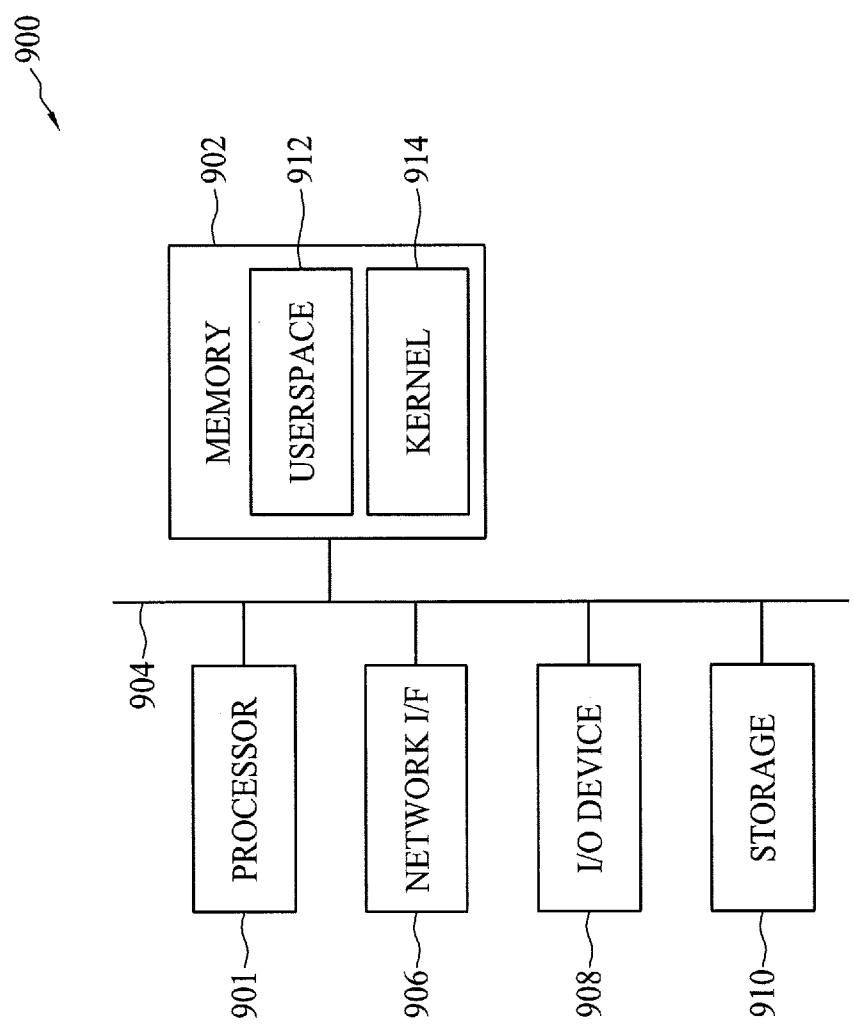
FIG. 9 illustrates a block diagram of a computer system to perform the method of FIG. 1, in accordance with some embodiments.

FIG. 9 is a block diagram of a computer system 900 in accordance with some embodiments. One or more of the tools and/or engines and/or systems and/or operations described with respect to FIGS. 1-8 is realized in some embodiments by one or more computer systems 900 of FIG.

9. The system 900 comprises at least one processor 901, a memory 902, a network interface (I/F) 906, an input/output (I/O) device 908, and a storage 910 communicatively coupled via a bus 904 or other interconnection communication mechanism.

The memory 902 comprises, in some embodiments, a random access memory (RAM) and/or other dynamic storage device and/or read only memory (ROM) and/or other static storage device, coupled to the bus 904 for storing data and/or instructions to be executed by the processor 901. The memory 902 can further include a userspace 912, kernel 914, portions of the kernel and/or the userspace, and components thereof. The memory 902 is also used, in some embodiments, for storing temporary variables or other intermediate information during execution of instructions to be executed by the processor 901. In various embodiments, the memory 902 can be contained within a single integrated circuit or comprise a plurality of discrete memory devices operatively coupled to one another.

In some embodiments, a storage device 910, such as a magnetic disk or optical disk, is coupled to the bus 904 for storing data and/or instructions. The I/O device 908 comprises an input device, an output device and/or a combined input/output device for enabling user interaction with the system 900. An input device comprises, for example, a keyboard, keypad, mouse, trackball, trackpad, and/or cursor direction keys for communicating information and commands to the processor 901. An output device comprises, for example, a display, a printer, a voice synthesizer, etc. for communicating information to a user.

In some embodiments, one or more operations and/or functionality of the tools and/or engines and/or systems described with respect to FIGS. 1-8 are realized by the processor 901, which is programmed for performing such operations and/or functionality. In some embodiments, the processor 901 is configured as specifically configured hardware (e.g., one or more application specific integrated circuits (ASICs)). In accordance with various embodiments, the processor 901 may be implemented within a single integrated circuit (IC) or as multiple communicatively coupled IC's and/or discrete circuits. It is appreciated that the processor 901 can be implemented in accordance with various known technologies. In one embodiment, the processor 901 includes one or more circuits or units configurable to perform one or more functions or processes described herein by executing instructions stored in an associated memory, for example. In other embodiments, the processor 901 may be implemented as firmware (e.g., discrete logic components) configured to perform one or more functions or processes described herein. For example, in accordance with various embodiments, the processor 901 may include one or more controllers, microprocessors, microcontrollers, application specific integrated circuits (ASICs), digital signal processors, programmable logic devices, field programmable gate arrays, or any combination of these devices or structures, or other known devices and structures, to perform the functions described herein.

One or more of the memory 902, the I/F 906, the storage 910, the I/O device 908, and the bus 904 is/are operable to receive instructions, data, design constraints, design rules, netlists, layouts, models and/or other parameters for processing by the processor 901.

In some embodiments, the operations and/or functionality are realized as functions of a program stored in a non-transitory computer readable recording medium. In at least one embodiment, the operations and/or functionality are realized as functions of a program, such as a set of executable instructions, stored in memory 902. In at least one embodiment, a gate-level netlist, such as the netlist 300 (FIG. 3A), is stored in a non-transitory computer readable recording medium for access by one or more operations as described herein. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In an embodiment, a method for performing a simulation on a circuit design includes: providing a register transfer level (RTL) description of the circuit design; providing a plurality of RTL-to-gate-level mapping details by translating the RTL description into a gate-level netlist; providing one or more input/output (I/O) variables as stimulus to simulate the RTL description of the circuit design; capturing a plurality of internal operation values from the simulated RTL description at a beginning time of a specified period of time, wherein the specified period of time is less than a time period required to compete a full-scale simulation; mapping the captured internal operation values to corresponding gate-level nodes of the gate-level netlist; capturing a plurality of I/O values from the I/O variables at the beginning time of the specified period of time; and simulating the circuit design in a gate-level for the specified period of time based on the mapped internal operation values and the captured I/O values.

In another embodiment, a system includes a memory storing computer-executable instructions, and one or more hardware processors coupled to the memory. The one or more hardware processors are configured to: provide a register transfer level (RTL) description of a circuit design; provide a plurality of RTL-to-gate-level mapping details by translating the RTL description into a gate-level netlist; provide one or more input/output (I/O) variables as stimulus to simulate the RTL description of the circuit design; capture a plurality of internal operation values from the simulated RTL description at a beginning time of a specified period of time, wherein the specified period of time is less than a time period required to compete a full-scale simulation; map the captured internal operation values to corresponding gate-level nodes of the gate-level netlist; capture a plurality of I/O values from the I/O variables at the beginning time of the specified period of time; and simulate the circuit design in a gate-level for the specified period of time based on the mapped internal operation values and the captured I/O values.

Yet in another embodiment, a method for performing a simulation on a circuit design includes: providing a register transfer level (RTL) description of the circuit design; providing a plurality of RTL-to-gate-level mapping details by translating the RTL description into a gate-level netlist; providing one or more input/output (I/O) variables as stimulus to simulate the RTL description of the circuit design; capturing a plurality of internal operation values from the simulated RTL description at a beginning time of a specified period of time, wherein the specified period of time is less than a time period required to compete a full-scale simulation; mapping the captured internal operation values to corresponding gate-level nodes of the gate-level netlist based on the RTL-to-gate-level mapping details; capturing a plurality of I/O values from the I/O variables at the beginning time of the specified period of time; simulating the circuit design in a gate-level for the specified period of time based on the mapped internal operation values and the captured I/O values to generate a value change dump file based on the gate-level simulation of the circuit design, wherein the value change dump file includes toggling information of each gate-level node of the gate-level netlist; and estimating power consumption of the circuit design based on the value change dump file.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for performing a simulation on a circuit design, comprising:
   providing a register transfer level (RTL) description of the circuit design;
   providing a plurality of RTL-to-gate-level mapping details by translating the RTL description into a gate-level netlist;
   providing one or more input/output (I/O) variables as stimulus to simulate the RTL description of the circuit design;
   capturing a plurality of internal operation values from the simulated RTL description at a beginning time of a specified period of time during which at least one operation phase of the circuit design is completed, wherein the specified period of time is less than a time period required to compete a full-scale simulation during which all operation phases of the circuit design are completed;
   mapping the captured internal operation values to corresponding gate-level nodes of the gate-level netlist;
   capturing a plurality of I/O values from the I/O variables at the beginning time of the specified period of time; and
   simulating the circuit design in a gate-level for the specified period of time based on the mapped internal operation values and the captured I/O values.

2. The method of claim 1, further comprising:
   generating a value change dump file based on the gate-level simulation of the circuit design, wherein the value change dump file includes toggling information of each gate-level node of the gate-level netlist.

3. The method of claim 2, further comprising:
   estimating power consumption of the circuit design based on the value change dump file.

4. The method of claim 1, wherein the RTL description includes a plurality of variables and operators that defines operations of the circuit design.

5. The method of claim 1, wherein the gate-level netlist includes a plurality of logic gates, and/or registers that are interconnected with one another based on the RTL description.

6. The method of claim 1, wherein the mapping of the captured internal operation values to corresponding gate-level nodes of the gate-level netlist includes using the plurality of RTL-to-gate-level mapping details.

7. The method of claim 1, wherein each of the captured internal operation values represents a respective logical state on the corresponding gate-level node at the beginning time of the specified period of time.

8. The method of claim 1, wherein the one or more input/output (I/O) variables are provided in a test bench environment.

9. A system comprising:
   a memory storing computer-executable instructions; and
   one or more hardware processors coupled to the memory and configured to:
      provide a register transfer level (RTL) description of a circuit design;
      provide a plurality of RTL-to-gate-level mapping details by translating the RTL description into a gate-level netlist;
      provide one or more input/output (I/O) variables as stimulus to simulate the RTL description of the circuit design;
      capture a plurality of internal operation values from the simulated RTL description at a beginning time of a specified period of time during which at least one operation phase of the circuit design is completed, wherein the specified period of time is less than a time period required to compete a full-scale simulation during which all operation phases of the circuit design are completed
      map the captured internal operation values to corresponding gate-level nodes of the gate-level netlist;
      capture a plurality of I/O values from the I/O variables at the beginning time of the specified period of time; and
      simulate the circuit design in a gate-level for the specified period of time based on the mapped internal operation values and the captured I/O values.

10. The system of claim 9, wherein the one or more hardware processors are further configured to generate a value change dump file based on the gate-level simulation of the circuit design, the value change dump file including toggling information of each gate-level node of the gate-level netlist.

11. The system of claim 10, wherein the one or more hardware processors are further configured to estimate power consumption of the circuit design based on the value change dump file.

12. The system of claim 10, wherein the RTL description includes a plurality of variables and operators that defines operations of the circuit design.

13. The system of claim 10, wherein the gate-level netlist includes a plurality of logic gates, and/or registers that are interconnected with one another based of the RTL description.

14. The system of claim 10, wherein the one or more hardware processors are configured to map the captured internal operation values to corresponding gate-level nodes of the gate-level netlist by using the plurality of RTL-to-gate-level mapping details.

15. The system of claim 10, wherein each of the captured internal operation values represents a respective logical state on the corresponding gate-level node at the beginning time of the specified period of time.

16. The system of claim 10, wherein the one or more input/output (I/O) variables are provided in a test bench environment.

17. A method for performing a simulation on a circuit design, comprising:
   providing a register transfer level (RTL) description of the circuit design;

providing a plurality of RTL-to-gate-level mapping details by translating the RTL description into a gate-level netlist;

providing one or more input/output (I/O) variables as stimulus to simulate the RTL description of the circuit design;

capturing a plurality of internal operation values from the simulated RTL description at a beginning time of a specified period of time during which at least one operation phase of the circuit design is completed, wherein the specified period of time is less than a time period required to compete a full-scale simulation during which all operation phases of the circuit design are completed mapping the captured internal operation values to corresponding gate-level nodes of the gate-level netlist based on the RTL-to-gate-level mapping details;

capturing a plurality of I/O values from the I/O variables at the beginning time of the specified period of time;

simulating the circuit design in a gate-level for the specified period of time based on the mapped internal operation values and the captured I/O values to generate a value change dump file based on the gate-level simulation of the circuit design, wherein the value change dump file includes toggling information of each gate-level node of the gate-level netlist; and estimating power consumption of the circuit design based on the value change dump file.

18. The method of claim 17, wherein the one or more input/output (I/O) variables are provided in a test bench environment.

19. The method of claim 17, wherein the RTL description includes a plurality of variables and operators that defines operations of the circuit design.

20. The method of claim 17, wherein the gate-level netlist includes a plurality of logic gates, and/or registers that are interconnected with one another based of the RTL description.

* * * * *